United States Patent
Weyburne et al.

(10) Patent No.: US 6,716,285 B1
(45) Date of Patent: Apr. 6, 2004

(54) SPIN COATING OF SUBSTRATE WITH CHEMICAL

(75) Inventors: David William Weyburne, Maynard, MA (US); Qing Sun-Paduano, Arlington, MA (US)

(73) Assignee: The United States of America as represented by the Secretary of the Air Force, Washington, DC (US)

(*) Notice: Subject to any disclaimer, the term of this patent is extended or adjusted under 35 U.S.C. 154(b) by 0 days.

(21) Appl. No.: 10/281,470

(22) Filed: Oct. 23, 2002

(51) Int. Cl.⁷ ............................................... B05C 11/02
(52) U.S. Cl. ..................... 118/52; 118/320; 427/240; 427/425
(58) Field of Search ................... 118/52, 320; 427/240, 427/425; 438/780, 782

(56) References Cited

U.S. PATENT DOCUMENTS

| | | | |
|---|---|---|---|
| 4,587,139 A | | 5/1986 | Hagan et al. |
| 4,794,021 A | | 12/1988 | Potter |
| 4,800,836 A | | 1/1989 | Yamamoto et al. |
| 5,013,586 A | | 5/1991 | Cavazza |
| 5,234,499 A | | 8/1993 | Sasaki et al. |
| 5,449,405 A | | 9/1995 | Cardinali et al. |
| 5,472,502 A | | 12/1995 | Batchelder |
| 5,538,758 A | * | 7/1996 | Beach et al. ............. 427/255.6 |
| 5,562,772 A | | 10/1996 | Neoh |
| 5,707,687 A | * | 1/1998 | Ueda et al. ................. 427/240 |
| 5,718,763 A | * | 2/1998 | Tateyama et al. ............. 118/52 |
| 6,165,267 A | | 12/2000 | Torczynski |
| 6,168,660 B1 | | 1/2001 | Hayes et al. |
| 6,228,561 B1 | | 5/2001 | Hasebe et al. |
| 6,238,735 B1 | | 5/2001 | Mandal et al. |
| 6,248,398 B1 | | 6/2001 | Talieh et al. |
| 6,261,635 B1 | * | 7/2001 | Shirley ........................ 427/240 |

OTHER PUBLICATIONS

Oztekin, Bornside & Brown, "The Connection Between Hydrodynamic Stability of Gas Flow in Spin Coating and Coated Film Uniformity," Mar. 15, 1995, pp. 2297–2308 (12 pages), J. Appl. Phys. 77, American Institute of Physics.

* cited by examiner

Primary Examiner—Richard Crispino
Assistant Examiner—Michelle Acevedo Lazor
(74) Attorney, Agent, or Firm—William G. Auton

(57) ABSTRACT

A spin coating apparatus and method of manufacturing incorporating a perforated sheet located above the substrate in a manner to control solvent evaporation that tends to occur in the coating vessel when the chuck is rotated without introducing additional airflow complications. The distance between the substrate surface and the perforated sheet, and the number, distribution, and size of the perforations in the perforated sheet can be adjusted to optimize the uniformity of film thickness coating the substrate. The result is reduced substrate and room contamination and enhanced coating uniformity.

2 Claims, 2 Drawing Sheets

SPIN COATING OF SUBSTRATE WITH CHEMICAL

RIGHTS OF THE GOVERNMENT

The invention described herein may be manufactured and used by or for the Government of the United States for all governmental purposes without payment of any royalty thereon.

BACKGROUND

1. Field of the Invention

The present invention relates to the field of spin coating, and in particular, the spin coating of chemical having uniform thickness onto a substrate.

2. Description of the Related Art

In a variety of fields, a thin film or coating of material on a substrate, such as data recording media or semiconductor wafers, is desired. In the field of fabricating semiconductor devices, for example, a thin layer of photoresist is commonly applied to a semiconductor wafer using a spin coating apparatus.

A typical spin coating apparatus comprises a chemical supply source, a coating element for introducing the chemical onto the substrate or wafer, and an exhaust element for removing excess chemical and contaminated air. Various properties and adaptations of spin coating apparatus are described in, for example, U.S. Pat. No. 6,165,267 issued Dec. 26, 2000 to Torczynski; U.S. Pat. No. 5,562,772 issued Oct. 8, 1996 to Neoh; U.S. Pat. No. 5,449,405 issued Sep. 12, 1995 to Cardinali et al.; U.S. Pat. No. 5,234,499 issued Aug. 10, 1993 to Sasaki et al.; U.S. Pat. No. 4,800,836 issued Jan. 31, 1989 to Yamamoto et al.; and U.S. Pat. No. 4,794,021 issued Dec. 27, 1988 to Potter, which are hereby incorporated herein by reference.

In typical prior art apparatus, the chemical supply source provides the desired chemical, commonly dissolved in a volatile solvent, to the coating element which includes a chemical dispensing means positioned above the wafer. The wafer, which is generally mounted on a rotatable chuck positioned within a coating bowl, receives the chemical from the chemical dispensing means, typically through one or more nozzles. The chemical is dispensed at or near the center of the wafer. The wafer on the chuck is then spun at high speed, at a particular rotation rate, using a motor assembly. This causes the chemical solution on the wafer to flow toward the edge of the wafer. As the solvent evaporates, the chemical solution becomes more and more viscous until the solution becomes so viscous it stops flowing. The remaining solvent eventually evaporates, leaving a thin film or coating on the wafer. The thickness of the chemical film on the wafer depends on a number of factors including, for example, the rate of rotation of the chuck and the rate at which the solvent evaporates.

It is known that if the solvent evaporates from a thinning film in a uniform manner, then the thickness of the resulting dry film will be of uniform thickness. Conversely, non-uniform solvent evaporation will result in a non-uniform film thickness. Solvent evaporation non-uniformity can be caused by non-uniformity in the gas flow over the spinning wafer. Because of the rotation, non-uniformities in the film thickness will tend to occur primarily in the radial direction rather than the circumferential direction.

To remove the evaporated solvent and excess chemical, a vacuum pump may be attached to the exhaust port to draw air into the coating bowl and over the exposed wafer surface, and then into the exhaust port and finally out of the spin coating apparatus into the vacuum pump system. In some cases, airflow is directed along the wafer underside into the exhaust port to minimize contamination of the wafer underside.

In a conventional spin coating apparatus, two main parameters govern the gas flow: the vacuum pumping rate and the rotation rate. Typical values used in the art are pumping rates of 250–1000 liters per minute (1 pm) and rotation rates of 0–5000 revolutions per minute (rpm). Because of the effect of viscosity, a swirling component of velocity is imparted by the substrate to the adjacent gas. This gas is centrifuged radially outward toward the outer edge of the substrate. The continuing removal of gas adjacent to the substrate in the radial direction draws air from the ambient supply above the substrate toward the surface to replace the displaced gas. At the same time, the vacuum pump system is removing gas via the exhaust port. Therefore, the airflow over the substrate is governed by the complex interaction of airflow due to the substrate pumping air by centrifuge action, airflow due to the vacuum pumping system, and the aerodynamic geometry of the spin coating apparatus.

In a conventional spin coating apparatus, the complex interaction of flows and geometry is known to result in the formation of wafer eddies. These eddies return a portion of the centrifuged gas back to the wafer surface. The changes in airflow above the wafer where the eddies are located causes the solvent to evaporate at a different rate than it would in the absence of such eddies. This local non-uniform rate of solvent evaporation results in non-uniform chemical film thickness.

The spin coating process is but one of many steps in the manufacturing of semiconductor devices. It is known in the art that even small thickness variations of the spun-on chemical film, on the order of $\frac{1}{10}^{th}$ of one percent of the mean film thickness, can result in lower yields of suitable semiconductor devices. As the diameter of the semiconductor wafer increases, the uniformity of the thickness of the film becomes increasingly important.

It is common in the art to use complicated empirical strategies to achieve the required uniformity of film thickness. In some cases, for example, the dispensed chemical is heated slightly and the nozzle is moved over the wafer in a complicated trajectory during dispensing. Such devices can add considerable complexity and initial cost, and the heating and nozzle trajectory must be changed every time a new chemical is used or the wafer size is changed.

A variety of other devices have been designed in an attempt to improve the uniformity of film thickness. Many attempts have been made to slow the evaporation rate of the chemical solution on the wafer surface and to prevent local air disturbances at the wafer surface. In particular, multiple attempts to minimize or eliminate the surface effects from the ambient air by imposing a barrier, serving as a means to isolate the local air over the wafer, have been attempted. See, e.g., U.S. Pat. No. 6,261,635 issued Jul. 17, 2001 to Shirley; U.S. Pat. No. 6,238,735 issued May 29, 2001 to Mundal et al.; U.S. Pat. No. 5,472,502 issued Dec. 5, 1995 to Batchelder; U.S. Pat. No. 4,800,836 issued Jan. 31, 1989 to Yamamoto et al., and U.S. Pat. No. 4,587,139 issued May 6, 1986 to Hagan et al. These attempts, however, introduce additional complications by impeding the airflow above the wafer and often add considerable cost and complexity.

Significant surface effects that contribute to the non-uniformity of film thickness, known as Ekman spirals, are known in the art (see, e.g., 77 J. Appl. Phys. 2297, *The*

*Connection Between-Hydrodynamic Stability of Gas Flow in Spin Coating and Coated Film Uniformity*, 1995). These spirals include both Type-I or "stationary" spirals, which rotate at the same speed as the wafer and thus do not move with respect to the wafer, and Type-II or "traveling" spirals, which do not rotate with the wafers and therefore move at considerable velocity with respect to the wafer surface. It is highly desirable to interfere with the formation of these Ekman spirals.

A second concern is contamination of the wafer surface by material such as droplets of chemical flung off the wafer during spinning. Airflow as described above can transport much of the excess chemical and solvent to the exhaust port. With conventional spin coating apparatus, high airflow rates can be required to prevent unacceptable wafer contamination. However, higher airflow generally means a higher risk of turbulence and eddy formation at the wafer surface. This can result in local variations of the solvent drying rate, and therefore a higher risk of undesirable thickness variations of the chemical film.

A third concern is contamination of the room environment by material such as volatile solvent or excess chemical. As in the case of wafer contamination, higher airflow rates can be required to prevent unacceptable room environment contamination. However, as already noted, higher airflow generally means a higher risk of turbulence and eddy formation above the wafer, which means a higher risk of undesirable thickness variations of the applied chemical. Also, since most spin coaters are located in special dust-free clean rooms, excessive room contamination results in higher operating costs. While some devices have utilized various forms of coverings, and even sealed coating bowls, these devices introduce added cost and complexity and frequently introduce new airflow-related problems further degrading the chemical layer thickness uniformity.

Accordingly, there is a need for an improved spin coating apparatus of economical design that minimizes thickness variations of the coated chemical and at the same time minimizes wafer and room contamination without introducing additional airflow-related complications at or near the wafer surface.

SUMMARY

To achieve these and other objects, the present invention provides a spin coating apparatus and process for applying a coating of uniform thickness to a substrate. In particular, the spin coating apparatus utilizes a perforated sheet of thin but rigid material, such as metal, positioned just above the wafer's top surface. The perforated sheet extends in a radial direction and may be attached to the coating bowl at the sheet edges. The chemical mixture, typically consisting of photoresist, is dispensed onto the wafer through an opening in the perforated sheet near the center using a conventional nozzle dispensing system. Air is drawn through the perforated sheet and directed over the wafer to the exhaust. Increasing the number of perforations or the size of the perforations, or both, will result in increased airflow, which will result in faster solvent evaporation rates. As the solvent evaporates from the chemical mixture, the viscosity of the mixture becomes larger and larger until the chemical mixture ceases to flow. Hence the local thickness of the spread film becomes fixed. The size and number of perforations can be adjusted, by one skilled in the art, in a radial direction from the center to the edge so as to control the local rate of solvent evaporation from the chemical film in a radial direction. This, in turn, allows some control of the radial thickness variations of the applied chemical.

By experiment, an optimum height of the perforated sheet above the wafer surface is determined. At the optimum height, airflow instabilities above the wafer are prevented from forming. Airflow instabilities can change the local evaporation rate of the solvent, which, in turn, can adversely affect the thickness uniformity of the deposited chemical. Optimum height is defined as the height that minimizes film thickness non-uniformity.

The perforated sheet also acts as a partial physical barrier that reduces the amount of wafer surface and room contamination from excess chemical and solvent that re-circulates after it is thrown off the wafer during spinning thereby impacting into the sidewalls of the chemical bowl.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

BRIEF DESCRIPTION OF THE DRAWINGS

While the specification concludes with claims particularly pointing out and distinctly claiming that which is regarded as the present invention, the features, objects, and advantages of the present invention can be more readily ascertained with reference to the following description, in conjunction with the accompanying drawings, in which:

DESCRIPTION

Figure 1:
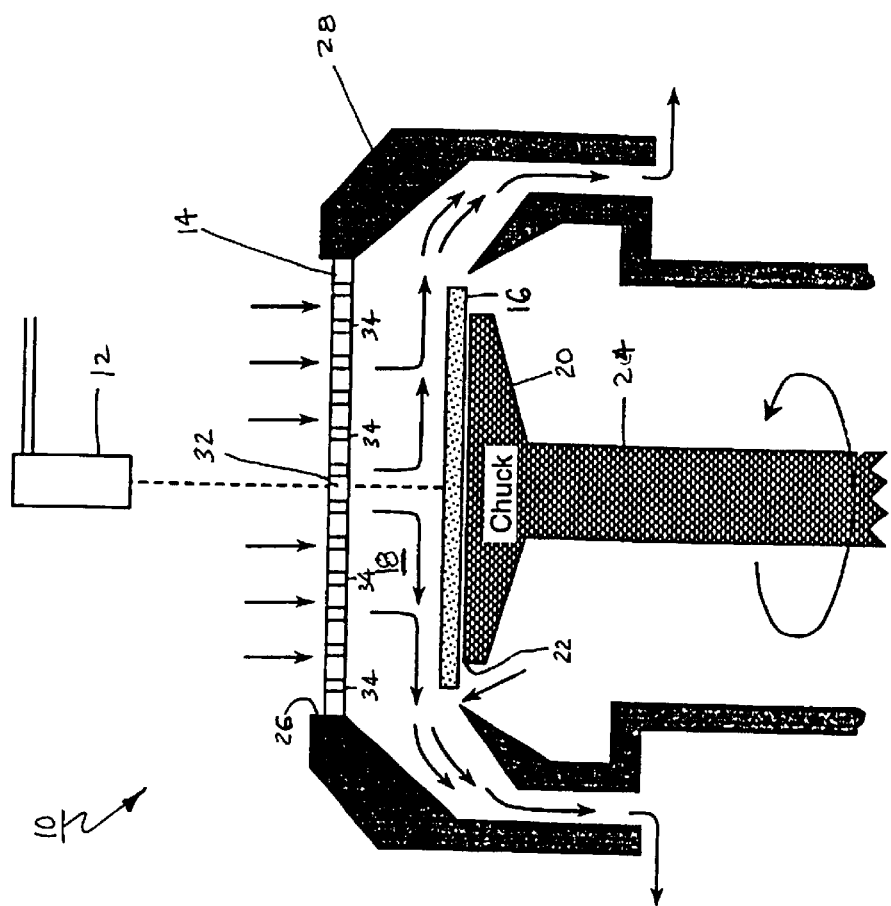
FIG. 1 is a side view of one embodiment of the invention.

Referring to the drawings, FIG. 1 depicts the spin coating apparatus 10 having the chemical dispensing means 12 positioned above the perforated sheet 14. The perforated sheet 14 is positioned in a horizontal plane above, and parallel with, the substrate 16. The air gap 18 is defined as the distance between the bottom surface of the perforated sheet 14 and the top surface of the substrate 16. The optimum height of the perforated sheet 14 above the substrate 16 is determined through experimentation, as described below, to an optimum distance for the specific chemical introduced through the chemical dispensing means 12 and the specific size and shape of the substrate 16. The air gap 18, depending on the size of the substrate 16, is normally within the preferred range of between about one (1) mm and one (1) cm. The substrate 16 is supported by the chuck 20, having a horizontal platform 22 parallel with the substrate 16, and supported by the vertical shaft 24, which is controlled by a motor (not shown) for rotating the substrate 16 and chuck 20 about the vertical axis passing through the center of the substrate 16. In one embodiment, the perforated sheet 14 is supported by the interior vertical wall 26 of the coating bowl 28. The coating bowl 28 further includes the exhaust port 30.

The perforated sheet 14 is composed of a thin and relatively inflexible material, preferably metal or other composite, having a center perforation 32, which is preferably between about two (2) cm and five (5) cm in diameter, and one or more minor perforations 34, which are preferably of between about one (1) mm and one (1) cm in diameter. The perforations are generally round in shape, though they may be of any shape allowing airflow between the upper and lower surface of the perforated sheet 14, such as oval, square, linear or curved slits, or one or more continuous spirals. The minor perforations 34 are preferably positioned uniformly along the perforated sheet 14 at any given radial distance from the center but may vary along the perforated sheet 14 with the radial distance from the center.

The amount of airflow reduction is controlled by the size, distribution, and number of minor perforations 34. The local open area density is defined locally on the perforated sheet 14 as the fraction of open area divided by the total area in that local area. The fractional open area is calculated by dividing the perforated sheet 14 open area by the total area of the perforation sheet 14 in a given local area on the perforated sheet 14. The area of the surface of the perforated sheet 14, after subtracting the total area of the center perforation 32 and all minor perforations 34, is preferably between about thirty (30) and eighty (80) percent of the total area of the perforated sheet 14. That is, the total open area is between about twenty (20) and seventy (70) percent. Accordingly, the perforations are positioned in the perforated sheet 14 so as to permit a relatively large percentage of the ambient air to flow through the perforated sheet 14.

Figure 2:
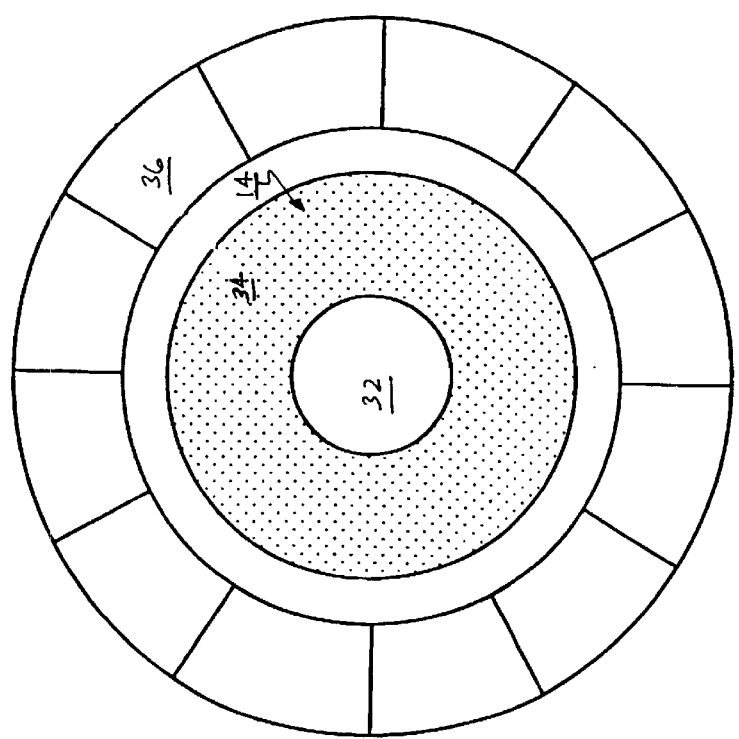
FIG. 2 is a top view of the apparatus depicted in FIG. 1.

Referring to FIG. 2, one embodiment of the perforated sheet 14 is shown in detail having a center perforation 32 and minor perforations 34. The edge of the perforated sheet 14 may be rigidly connected to the coating bowl 28 or, in an alternate embodiment, the perforated sheet 14 may be supported by spacers 36, connecting the perforated sheet 14 to the coating bowl 28. The spacers 36 may be used to adjust the airflow between the edge of the perforated sheet 14 and the interior vertical wall 26 of the coating bowl 28.

The spin coating apparatus 10 is operated in a clean room to avoid contamination. The chemical solution is introduced from the chemical dispensing means 12 through the center perforation 32 in the perforated sheet 14 and onto the center portion of the substrate 16. The chuck 20 and substrate 16 are rotated at moderate speed, such as, for example, 400 rotations per minute (rpm), to allow the chemical solution to spread outwardly, in a radial direction, over the surface of the substrate 16. After all of the chemical solution has been dispensed, the speed of rotation is increased to its maximum speed, preferably between about 1000 and 5000 rpm, to spin off excess chemical solution. In the preferred embodiment, the chuck 20 is spun in a counter-clockwise direction when viewed from the chemical dispensing means 12.

The volatile solvent begins evaporating immediately after being dispensed and continues during the high speed spin-off. The dispensed chemical solution film is thinned both by centrifugally driven action of spinning and the solvent evaporation from the chemical solution. The final thickness profile is set when the solvent evaporation causes the chemical solution film to become so viscous that it stops flowing.

The coating bowl 28 is open to the ambient air within the clean room, which flows through the perforations in the perforated sheet 14 and out the exhaust port 30. In preferred embodiments, a vacuum pump (not shown) is used to draw the air out of the exhaust port 30. The perforated sheet 14 interferes with the Ekman spirals, thereby improving the uniformity of thickness of the chemical on the substrate, while at the same time limiting additional airflow complications by virtue of the relatively unimpeded airflow through the minor perforations 34.

In practice, the preferred embodiment is constructed through experimentation. For example, the first set of experiments might consist of coating a substrate 16 using a perforated sheet 14 having different sizes of uniformly shaped minor perforations 34 and uniform open area densities. After the substrate 16 is coated and dried, the chemical film uniformities are measured using methods known in the art. The number and size of the minor perforations 34, open area density, and diameter of the center perforation 32 that result in the best chemical film uniformity is chosen as the basis for the next set of experiments. If, by way of example, it is determined that this latter film is thinner in the center and increases radially toward the edge of the substrate 16, a new perforated sheet 14, having different characteristics with regard to the size, shape, distribution, and number of minor perforations 34 or the size of the center perforation 32, is then selected. By changing the perforation size and/or the local open area density in the radial direction from center to the edge, the airflow can be changed and therefore the chemical film thickness can be changed. Accordingly, in this example, a perforated sheet 14 is selected with an increasing local open area in the perforated sheet 14 in the area above the edge of the substrate 16.

Once the optimum perforated sheet 14 is selected, the optimum air gap 18 is also determined through experimentation. After a new substrate 16 is coated and dried, the chemical film uniformities are again measured using techniques known in the art. The process is repeated until the desired uniformity of chemical film thickness is obtained.

The presence of the perforated sheet 14 also acts as a physical barrier that prevents solvent and excess chemical solution from re-circulating and depositing on the substrate 16. It also prevents release of these same contaminants into the clean room housing the spin coating apparatus 10.

Characteristics of the described and illustrated embodiments are intended for illustrative purposes and are not to be considered limiting or restrictive. It is to be understood that various adaptations and modifications may be made to the embodiments presented herein by those skilled in the art without departing from the spirit and scope of the invention, as defined by the following claims and equivalents thereof.

That which is claimed is:

1. A Spin coating apparatus comprising:
   a chuck for supporting and spinning a substrate, wherein the substrate is positioned in the horizontal plane, and said chuck and the substrate are positioned with a coating bowl;
   a perforated sheet positioned in the horizontal plane between 1 millimeter and 1 centimeter above the substrate, said perforated sheet having perforation means for allowing fluid communication of ambient air through said perforated sheet;
   a chemical dispensing means for introducing a chemical onto the substrate, wherein said chemical dispensing means is positioned above the substrate;
   wherein said perforation means comprises a plurality of holes in said perforated sheet; and wherein said plurality of holes vary in diameter with the radial distance from the center of said perforated sheet.

2. A method of manufacturing semiconductor devices, said method comprising the steps of:
   positioning a substrate in the horizontal plane onto a chuck wherein said chuck is positioned within a mixing coating bowl; positioning a perforated disk in the horizontal plane between 1 millimeter and 1 centimeter above the substrate, wherein said perforated disk includes a plurality of holes allowing fluid communication of ambient air through said perforated disk; depositing a chemical onto the substrate; spinning said chuck whereby said chemical spreads out over the surface of the substrate, wherein said plurality of holes in said perforated disk vary in diameter with the radial distance from the center of said perforated disk.

* * * * *